United States Patent
Pachler et al.

(10) Patent No.: US 12,051,640 B2
(45) Date of Patent: Jul. 30, 2024

(54) CHIP CARD BODY, METHOD FOR FORMING A CHIP CARD BODY AND CHIP CARD

(71) Applicant: Infineon Technologies AG, Neubiberg (DE)

(72) Inventors: Walther Pachler, Wetzelsdorf (AT); Michael Huber, Nittendorf/Undorf (DE); Jens Pohl, Bernhardswald (DE); Szabolcs Tompa-Antal, Wildon (AT)

(73) Assignee: Infineon Technologies AG, Neubiberg (DE)

( * ) Notice: Subject to any disclaimer, the term of this patent is extended or adjusted under 35 U.S.C. 154(b) by 389 days.

(21) Appl. No.: 17/498,828

(22) Filed: Oct. 12, 2021

(65) Prior Publication Data

US 2022/0115311 A1    Apr. 14, 2022

(30) Foreign Application Priority Data

Oct. 13, 2020   (DE) .......................... 102020126881.5

(51) Int. Cl.
     *H01L 23/498*      (2006.01)
     *H01L 21/48*      (2006.01)
     *H01L 23/14*      (2006.01)
     *H01L 23/64*      (2006.01)

(52) U.S. Cl.
     CPC .... *H01L 23/49822* (2013.01); *H01L 21/4857* (2013.01); *H01L 23/142* (2013.01); *H01L 23/642* (2013.01)

(58) Field of Classification Search
     CPC ........... H01L 23/49822; H01L 21/4857; H01L 23/142; H01L 23/642; G06K 19/0726; G06K 19/07749; G06K 19/07756; G06K 19/07775; G06K 19/02
See application file for complete search history.

(56) References Cited

U.S. PATENT DOCUMENTS

| | | | | |
|---|---|---|---|---|
| 2007/0267673 | A1* | 11/2007 | Kim | H01L 27/0808 257/E27.048 |
| 2016/0118711 | A1* | 4/2016 | Finn | H01Q 1/2216 343/867 |
| 2018/0042110 | A1* | 2/2018 | Cok | H01L 25/105 |
| 2019/0197384 | A1* | 6/2019 | Pachler | H04B 5/70 |

FOREIGN PATENT DOCUMENTS

| | | |
|---|---|---|
| DE | 102013103365 A1 | 10/2013 |
| DE | 102017130940 B4 | 7/2019 |
| DE | 102018105383 A1 | 9/2019 |

OTHER PUBLICATIONS

German Patent Office, Office Action issued for DE 102020126881. 5, 10 pgs., dated: May 31, 2021.

\* cited by examiner

*Primary Examiner* — Moazzam Hossain
(74) *Attorney, Agent, or Firm* — Banner & Witcoff Ltd.

(57) ABSTRACT

A chip card body including a metal plate having at least one slot which defines a current flow path on the metal plate, and having a coupling region to accommodate a chip with an antenna, wherein the coupling region is configured to inductively couple the metal plate to the antenna of the chip, a dielectric layer applied to the metal plate, an electrically conductive layer applied to a side of the dielectric layer opposite the metal plate, and at least one electrically conductive coupling between the metal plate and the electrically conductive layer, wherein the metal plate, the dielectric layer and the electrically conductive layer form a capacitor.

7 Claims, 7 Drawing Sheets

CHIP CARD BODY, METHOD FOR FORMING A CHIP CARD BODY AND CHIP CARD

TECHNICAL FIELD

The disclosure relates to a chip card body, a method for forming a chip card body and to a chip card.

BACKGROUND

Credit cards have been used as a means of payment for more than half a century, with paper cards being used before the distribution of plastic cards as a form of short-term credit for purchasing products and services.

Recently, plastic cards have been in competition with metal credit cards, which are being offered by more and more credit card manufacturers. One reason for this is the so-called "plunk factor", which expresses the impressive effect that can only be produced by metal and is produced when a metal credit card (with the characteristic sound and metallic glint) is thrown onto a sales counter. In this case, the metal credit card tends to be used as a status symbol, as metal credit cards were originally offered mainly to wealthy customers. Nowadays, however, metal credit cards (see e.g. the metal credit card example 100 from FIG. 1), are also offered to ordinary customers.

The cards 100 shown in FIG. 1 with metal bodies 106 are currently mainly provided as contact credit cards. This means that a data exchange with a chip in the credit card is carried out by making contact with contact surfaces integrated in a chip module 108, which are designed according to ISO 7816.

However, producing a properly tuned contactless metal chip card as simply as possible presents a challenge.

BRIEF DESCRIPTION OF THE DRAWINGS

Exemplary aspects of the disclosure are shown in the drawings and will be explained in more detail in the following.

In the Drawings

DETAILED DESCRIPTION

Figure 1:
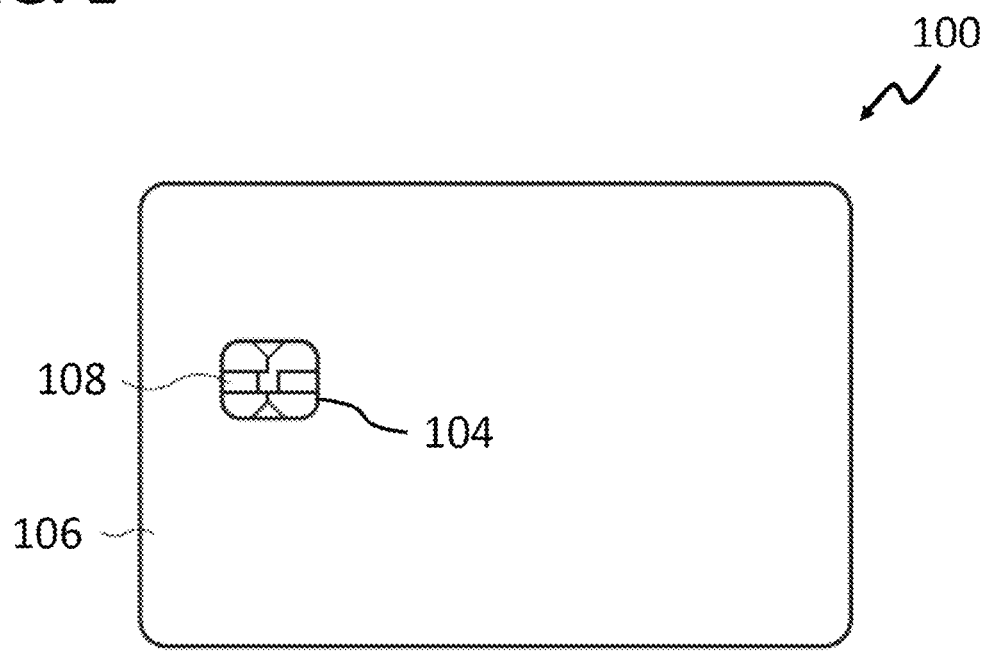
FIG. 1 shows a plan view of a conventional metal chip card.

In the detailed description that follows, reference will be made to the attached drawings, which form part of this description and in which specific aspects in which the disclosure may be realized are shown for illustration purposes. In this respect, directional terms such as "at the top", "at the bottom", "in front", "behind", "frontal", "rear", etc. are used with respect to the orientation of the figure(s) being described. Because components of aspects can be positioned in a number of different orientations, the directional terminology is used for illustration purposes only and is in no way restrictive. It is understood that other aspects can be used and structural or logical changes can be made without departing from the scope of protection of the present disclosure. It goes without saying that the features of the various exemplary aspects described herein can be combined with one another, unless specifically stated otherwise. The following detailed description is therefore not to be understood in a restrictive sense, and the scope of protection of the present disclosure is defined by the attached claims.

For the purposes of this description, the terms "connected" and "coupled" are used to describe both a direct and an indirect connection, as well as a direct or indirect coupling. In the figures, identical or similar elements are labeled with identical reference numerals, where this is appropriate.

Figure 2A:
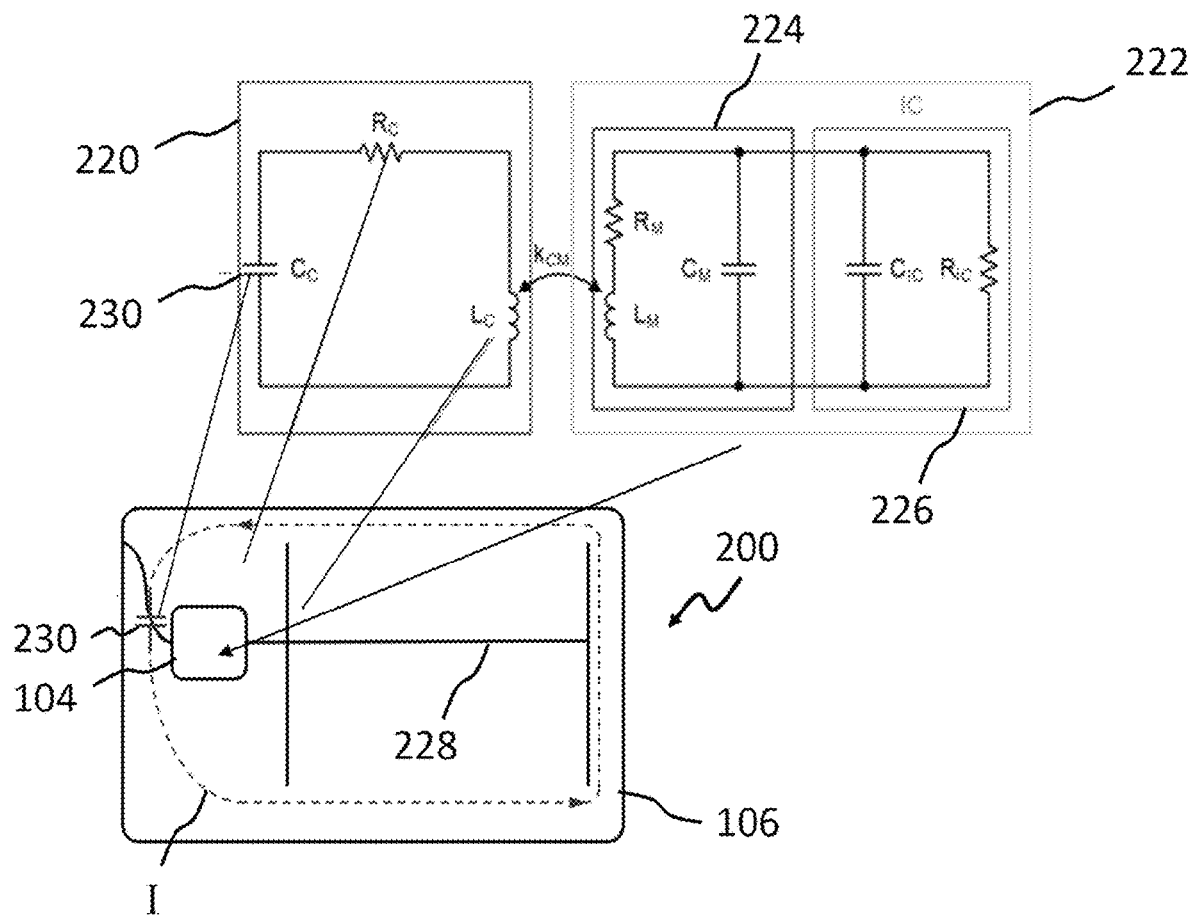
FIG. 2A shows a schematic illustration of functional elements of a metal chip card body.

According to an internal conventional chip cards (see FIG. 2A and FIG. 2B), chip cards 201 with a chip card body 200 made of metal are manufactured in such a way that the metal 106 of the chip card body 200 itself forms a booster antenna (illustrated by the current flow I) by means of slots 228 formed in the metal 106. The inductance $L_c$ is realized by the slotted metal plate, the resistance $R_c$ by the ohmic resistance of the metal plate, and the capacitor in FIG. 2A by an external (to the metal plate 106) capacitor 230. The booster antenna inductively couples to a chip module 222 with an antenna (using the so-called coil-on-module technology) which is inserted into an opening 104 of the chip card body 200. Accordingly, there is no need to insert additional modules or provide separate booster antennas.

Such chip cards 201 are capable of meeting requirements regarding electrical compliance (for example, with regard to electrical compliance according to EMV' Contactless Specifications, where EMV stands for "Europay, Mastercard, Visa").

Figure 2B:
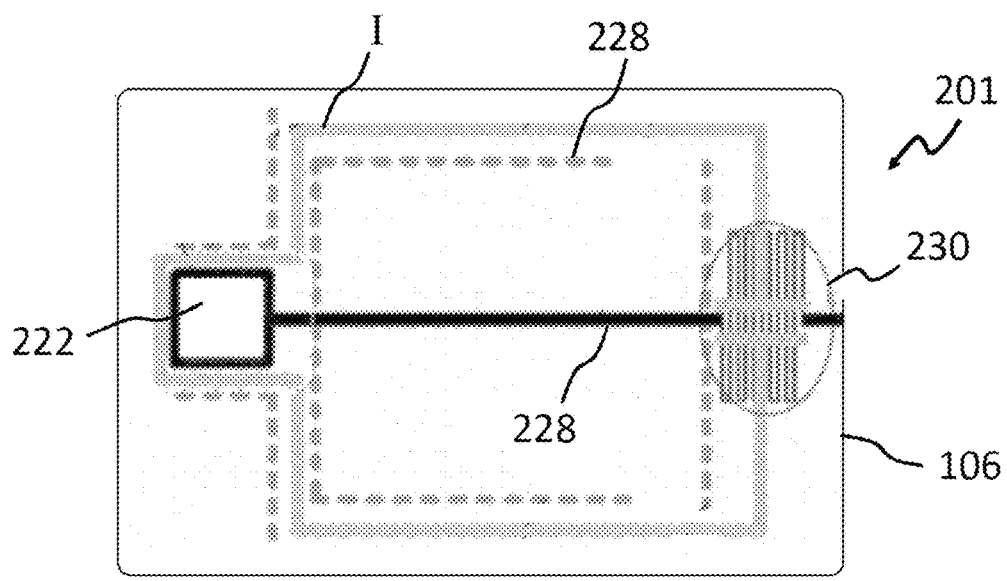
FIG. 2B shows a schematic illustration of a metal chip card body with integrated capacitor.

However, the devices currently used for tuning the booster antenna are capacitors 230, which are formed as finely slotted meandering structures in the metal 106 of the card body 200 (see FIG. 2B). However, experience in producing the devices has shown that it is difficult to construct the finely slotted structures in the metal 106.

In various exemplary aspects, a method for forming a chip card body is provided, according to which a capacitor or at least one of the capacitor plates is arranged on a metal plate which forms the chip card body (and at the same time a booster antenna).

In various exemplary aspects, the capacitor or the capacitor plate is arranged on the metal plate as at least one electrically conductive layer.

A dielectric layer, e.g. a dielectric adhesive, can be arranged between the electrically conductive layer and the metal plate.

In the case of one electrically conductive layer, this can form a capacitor together with the metal plate from which it is separated by means of the dielectric layer. The electrically conductive layer can be electrically conductively connected to the metal plate, for example by means of a via through the dielectric layer or, for example, by means of a region of conductive glue adjacent to the dielectric layer.

In the case of more than one electrically conductive layer, the e.g. two electrically conductive layers (e.g. together) can form a capacitor. The electrically conductive layers can be electrically conductively connected to the metal plate, for example, to opposite ends of the antenna formed by the metal plate, for example by means of vias through the dielectric layer(s) and/or, for example, by means of regions of electrically conductive glue.

Figure 3A:
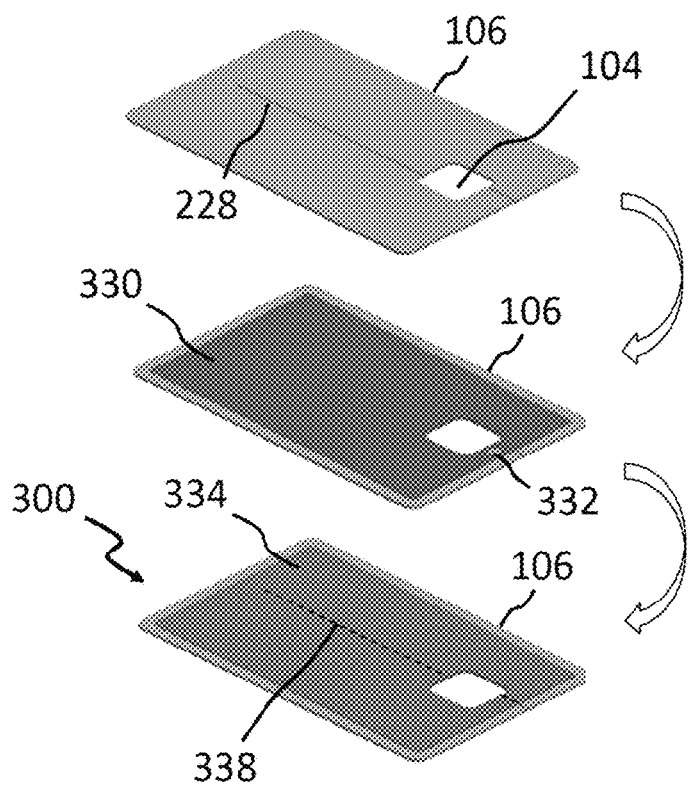
FIG. 3A shows an illustration of a method for producing a chip card body according to various exemplary aspects.
Figure 3B:
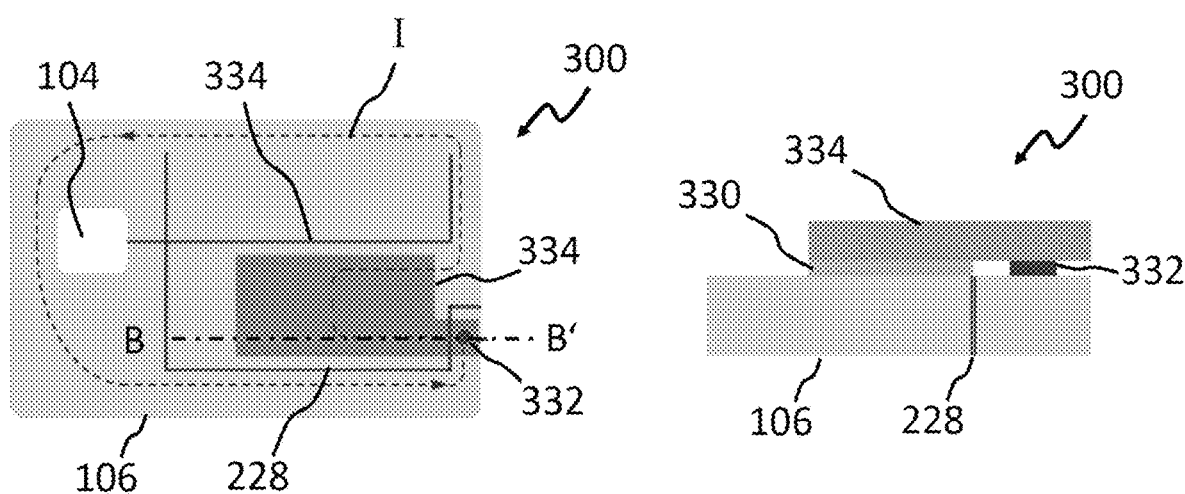
FIG. 3B shows a schematic plan view of a chip card body according to various exemplary aspects, and a schematic cross-sectional view along a line B-B' shown in the plan view.
Figure 3C:
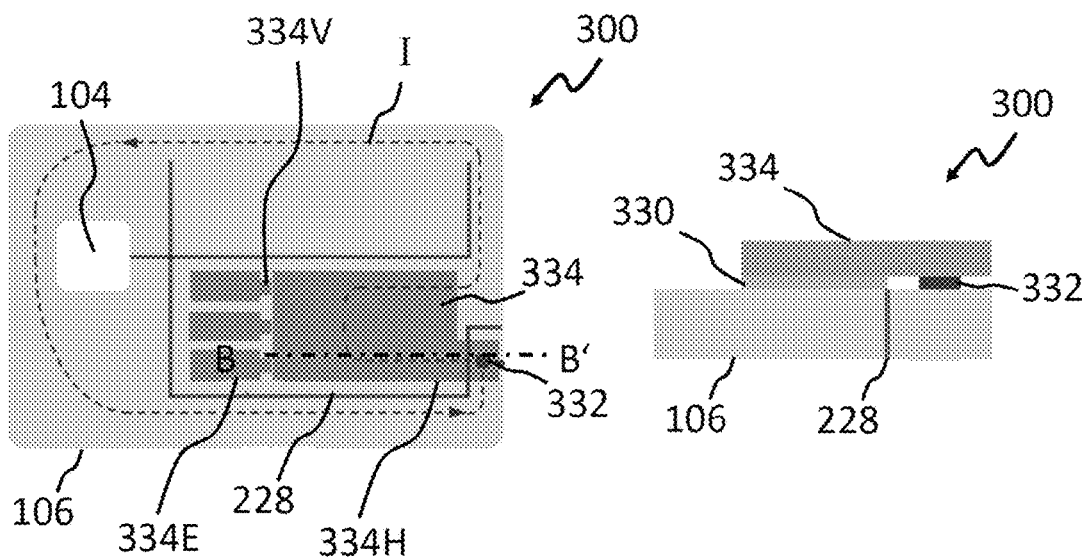
FIG. 3C shows a schematic plan view of a chip card body according to various exemplary aspects, and a schematic cross-sectional view along a line B-B' shown in the plan view.
Figure 7A:
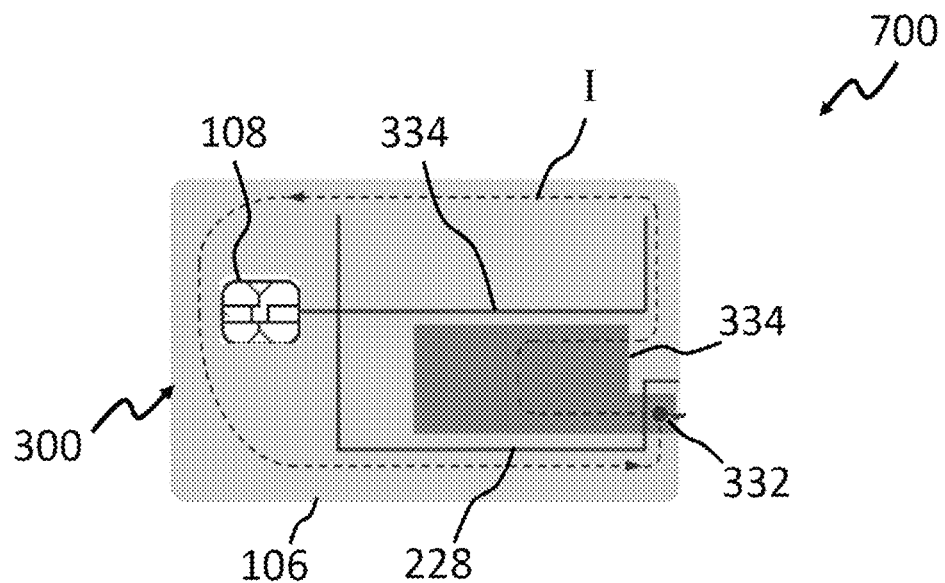
FIGS. 7A and 7B each show a schematic plan view of a chip card according to various exemplary aspects.

FIG. 3A shows an illustration of a method for producing a chip card body 300 according to various exemplary aspects, FIG. 3B shows a schematic plan view of a chip card body 300 according to various exemplary aspects and a schematic cross-sectional view along a line B-B' shown in the plan view, and FIG. 3C shows a schematic plan view of a chip card body 300 according to various exemplary aspects and a schematic cross-sectional view along a line B-B' shown in the plan view. FIG. 7A shows a schematic plan view of a chip card 700 according to various exemplary aspects.

According to various exemplary aspects which are illustrated by FIG. 3A, a chip card body 300 can comprise a metal plate 106 with at least one slot 228 which defines a current flow path I on the metal plate 106 so that the metal plate 106 forms a booster antenna.

Figure 7B:
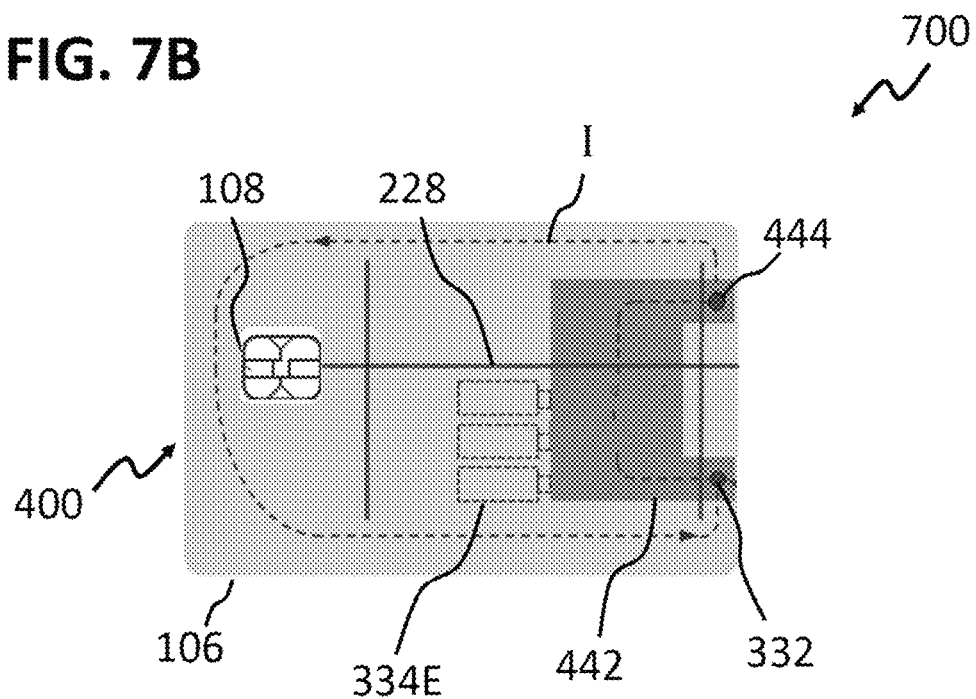

In the metal plate 106, a coupling region 104 can also be formed for accommodating a chip with an antenna, which can be provided as chip module 108 (see FIG. 7A and FIG. 7B, for example). The coupling region 104 can comprise a receiving opening and a region of the metal plate 106 that surrounds the receiving opening.

The coupling region 104 can be configured for inductively coupling the metal plate 106 to the antenna of the chip, for example as illustrated in FIG. 2B by the fact that the antenna current path is routed closely around the receiving opening.

In various exemplary aspects the chip card body 300 can also comprise a dielectric layer 330, which is applied to the metal plate 106.

The dielectric layer 330 in various exemplary aspects can have any type of dielectric material which can be applied or attached in layers such that it adheres to metal. For example, the dielectric layer 330 can comprise a dielectric adhesive, e.g. an organic glue, such as an epoxy resin, polyvinyl chloride (PVC), an adhesive or similar.

In various exemplary aspects the chip card body 300 can also comprise an electrically conductive layer 334 applied to a side of the dielectric layer 330 opposite the metal plate, and at least one electrically conductive coupling 332, e.g. at least one galvanic contact, between the metal plate 106 and the electrically conductive layer 334.

The electrically conductive layer 334 in various exemplary aspects can be a metal layer, such as a copper layer, an aluminum layer, a metallic alloy, a metal layer stack, or similar.

The metal plate 106, the dielectric layer 330 and the electrically conductive layer 334 can form a capacitor.

In various exemplary aspects, the dielectric layer 330 can be applied to the metal plate 106 separately from the electrically conductive layer 334. An example of this is illustrated in FIG. 3A. In various exemplary aspects, the dielectric layer 330 and the electrically conductive layer 334 can be applied to the metal plate 106 together, for example, they can be laminated on as a layer stack.

For example, both the dielectric layer 330 and the electrically conductive layer 334 can be laminated on. The dielectric layer 330 can be applied by spraying or printing in various exemplary aspects. In various exemplary aspects both the dielectric layer 330 and the electrically conductive layer 334 can be applied using another suitable known method. In various exemplary aspects it may be necessary to cure the dielectric layer 330 after application.

The dielectric layer 330 and/or the electrically conductive layer 334 may only partially cover the metal plate 106 in various exemplary aspects. Exemplary designs are shown in FIG. 3B and FIG. 3C. For example, the electrically conductive layer 334 can be arranged in such a way that it does not cover any of the slots 228 formed in the metal plate 106.

In various exemplary aspects, the dielectric layer 330 and/or the electrically conductive layer 334 can essentially completely cover the metal plate 106. An example of this is shown in FIG. 3A. In various exemplary aspects, in this case the electrically conductive layer 334 can also be formed with slots 338, which can be arranged, for example, vertically above the slots 228 of the metal plate 106.

In various exemplary aspects the electrically conductive layer 334 can be designed in such a way, e.g. as described above, that the formation of eddy currents in the electrically conductive layer 334 is minimized.

In the exemplary aspects in which the capacitor is formed by the metal plate 106 and the electrically conductive layer 334, it may be sufficient to arrange only one electrically conductive coupling 332 between the metal plate 106 and the electrically conductive layer 334. For example, the electrically conductive layer 334 can be electrically conductively connected to the metal plate 106 near one of the ends of the antenna, for example by means of a via through the dielectric layer 330. An exemplary aspect is shown in FIG. 3A.

In various exemplary aspects the electrically conductive coupling 332 can be formed as an electrically conductive layer which is separated from the dielectric layer 330. The electrically conductive coupling 332 can be formed as a layer of electrically conductive adhesive, for example. An example of this is illustrated in FIG. 3B and FIG. 3C.

In various exemplary aspects a multiplicity of electrically conducting couplings 332 can be provided. In various exemplary aspects, in which only one electrically conductive layer 334 is present, these can be connected to the same end of the antenna.

In various exemplary aspects the electrically conductive layer 334 can comprise a main capacitor region 334H and at least one tuning region 334E. This is shown in FIG. 3C, for example. The at least one tuning region 334E can be used for optimal adjustment (tuning) of the resonance frequency of the antenna.

The at least one tuning region 334E can be connected to the main capacitor region 334H only by a narrow connecting region 334V, so that the tuning region 334E can be separated from the main capacitor region 334H by cutting through the connecting region 334V. Alternatively, the tuning region 334E can also be completely removed. The separation or removal can be performed by means of a laser, for example. The electrically conductive coupling 332 can be connected to the main capacitor region 334H.

In various exemplary aspects, the connecting region 334V can have a width not exceeding one tenth, e.g. one twentieth, e.g. one fiftieth, e.g. one hundredth, of the circumference of the electrically conductive layer 334.

In the exemplary aspect shown in FIG. 3C all the tuning regions 334E have the same surface area. In various exemplary aspects the tuning regions 334E can be formed with different surface areas, so that a different total capacitor area is obtained depending on which of the tuning regions 334 is separated from the main capacitor region 334H.

An example calculation of a required capacitor surface area that is desired for tuning the antenna with a specified capacitance is illustrated in the following table, where the capacitance of a parallel plate capacitor is calculated in the following known manner:

$C = \varepsilon_0 \cdot \varepsilon_r \cdot A/d$, where A is the capacitor surface area, d is the distance between the capacitor plates, $\varepsilon_0$ is the permittivity of the vacuum, and $\varepsilon_r$ is the relative permittivity of the dielectric between the capacitor plates.

|  | Value | Unit | Comment |
|---|---|---|---|
| Constant |  |  |  |
| $\varepsilon_0$ | 8.85E−12 | [As/Vm] | Permittivity of the vacuum |
| $\varepsilon_r$ | 3.00E+00 | [ ] | Relative permittivity of the dielectric (here PVC) |
| Variable |  |  |  |
| A | 7.6E−4 | [m$^2$] | Area of the electrically conductive layer (here 20 mm × 38 mm) |
| d | 1.00E−05 | [m] | Thickness of the dielectric layer (here 10 μm) |
| Result |  |  |  |
| C | 2.02E−09 | [As/V] | Target Value: 2 nF (2.0E−09) |

FIG. 7A shows a chip card 700 which is produced using a chip card body 300 according to various exemplary aspects. The chip with the antenna connected thereto can be inserted into the chip card body 300 in an essentially known manner, for example as a glued-in chip module 108.

In various exemplary aspects, the chip card body 300 and/or the chip card 700 can be provided with additional protective layers over the electrically conductive layer 334.

Figure 5:
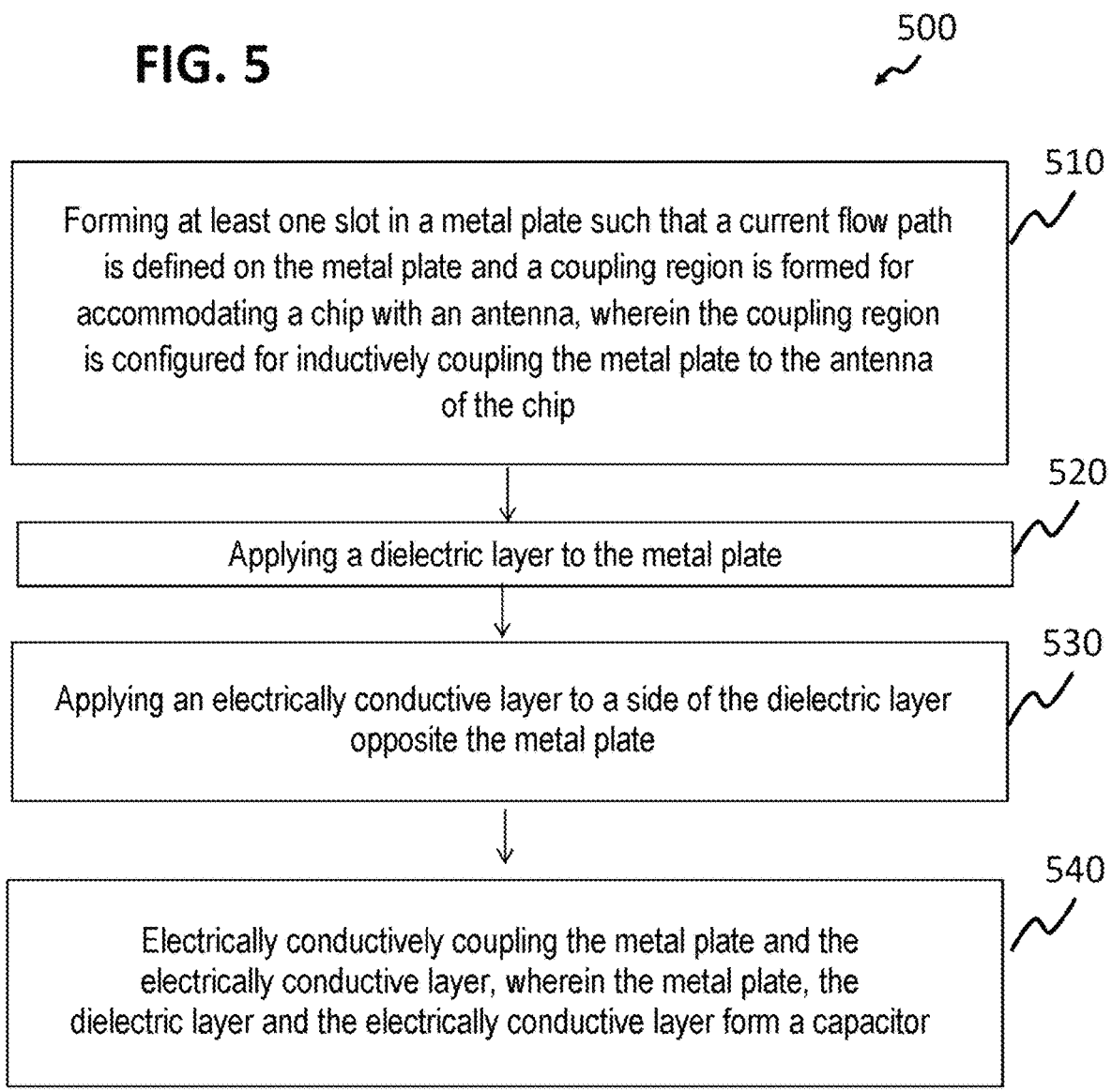
FIG. 5 shows a flowchart of a method for forming a chip card body according to various exemplary aspects.

FIG. 5 shows a flowchart 500 of a method for forming a chip card body according to various exemplary aspects.

The method comprises forming at least one slot in a metal plate such that a current flow path is defined on the metal plate and a coupling region is formed for accommodating a chip with an antenna, wherein the coupling region is configured for inductively coupling the metal plate to the antenna of the chip (at 510), applying a dielectric layer to the metal plate (at 520), applying an electrically conductive layer to a side of the dielectric layer opposite the metal plate (at 530) and electrically conductively coupling the metal plate and the electrically conductive layer, wherein the metal plate, the dielectric layer and the electrically conductive layer form a capacitor (at 540).

The above examples represent chip card bodies 300 and corresponding chip cards 700 or a corresponding method that are particularly simple to produce, since they require only one electrically conductive coupling 332 and only one electrically conductive layer 330 in order to form a capacitor from the metal plate 106 and the electrically conductive layer 330 as the second capacitor plate.

According to various exemplary aspects a more flexible chip card body 400 with regard to the design and arrangement of the capacitor can be formed using a somewhat more complex production method.

In this case the capacitor can be arranged with both capacitor plates on the metal plate 106 as a planar capacitor.

Figure 4:
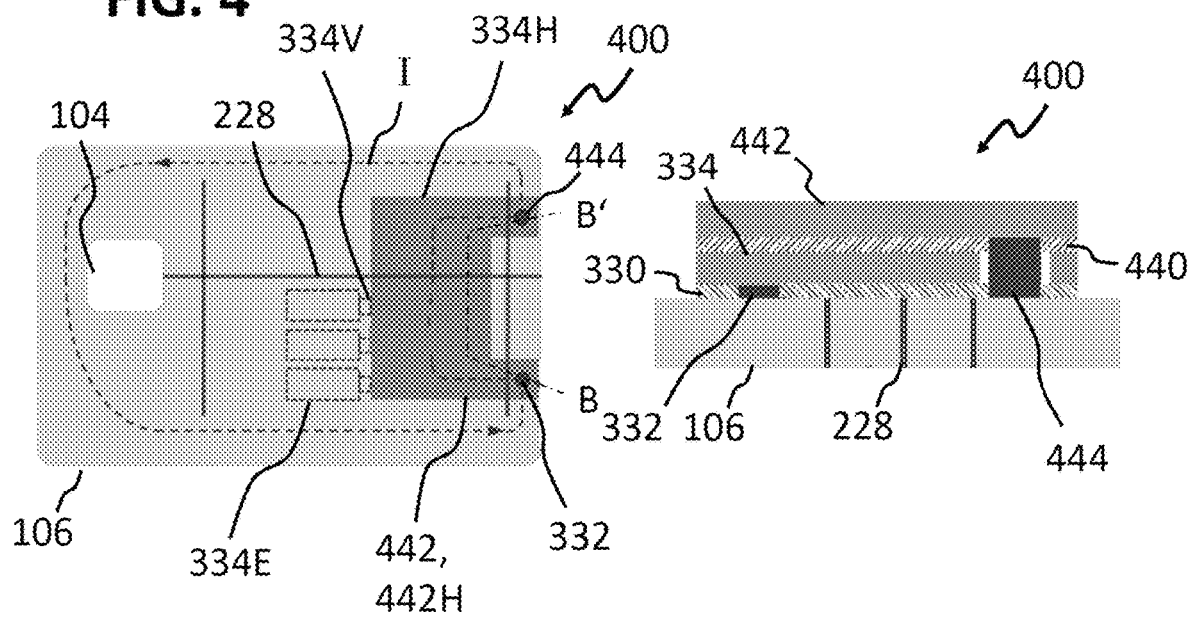
FIG. 4 shows a schematic plan view of a chip card body according to various exemplary aspects, and a schematic cross-sectional view along a line B-B' shown in the plan view.

FIG. 4 shows a schematic plan view of a chip card body 400 according to various exemplary aspects and a schematic cross-sectional view along a line B-B' shown in the plan view. FIG. 7B shows a schematic plan view of a chip card 700 according to various exemplary aspects.

The chip card body 400 can comprise a metal plate 106 with at least one slot 228 which defines a current path I on the metal plate 106 and with a coupling region 104 for accommodating a chip with an antenna, wherein the coupling region 104 is configured for inductively coupling the metal plate 106 to the antenna of the chip.

The chip card body 400 can also comprise a dielectric layer 330 which is applied to the metal plate 106, an electrically conductive layer 334 applied to a side of the dielectric layer 330 opposite the metal plate 106, a second dielectric layer 440 on the electrically conductive layer 334, a second electrically conductive layer 442 on the second dielectric layer 440, an electrically conductive coupling 332 between the metal plate 106 and the electrically conductive layer 334 and a second electrically conductive coupling 444 between the metal plate 106 and the second electrically conductive layer 442, wherein the electrically conductive layer 334, the second dielectric layer 440 and the second electrically conductive layer 442 form a capacitor.

Those elements which are present in both the chip card body 300 and in the chip card body 400 can be formed in essentially the same way or comprise the same materials, etc.

In various exemplary aspects the chip card body 400 can differ from the chip card body 300 in that the second dielectric layer 440 and the second electrically conductive layer 442 are additionally formed, and furthermore the second electrically conductive coupling 444 is formed between the metal plate 106 and the second electrically conductive layer 442 so that the two capacitor plates (the electrically conductive layer 330 and the second electrically conductive layer 442) are coupled to the antenna formed in the metal plate 106, for example, the electrically conductive layer 334 to a first end of the antenna and the second electrically conductive layer 442 to an opposite, second end of the antenna.

The second dielectric layer 440 can be formed in essentially the same way as the dielectric layer 330, and the second electrically conductive layer 442 can be formed in essentially the same way as the electrically conductive layer 334.

In various exemplary aspects, the second electrically conductive layer 442 (either only the second electrically conductive layer 442 or in addition to the conductive layer 334) can comprise a main capacitor region 442H and at least one tuning region (not shown because the tuning regions, which have been arranged vertically over and, for example, coincident with the tuning regions 334E of the electrically conductive layer 334, have been removed for the tuning), wherein the at least one tuning region is connected to the main capacitor region 442H only by a narrow connecting region, so that the tuning region can be separated from the main capacitor region by cutting through the connecting region.

In various exemplary aspects the connecting region of the second electrically conductive layer 442 can have a width not exceeding one tenth, e.g. one twentieth, e.g. one fiftieth, e.g. one hundredth of the circumference of the electrically conductive layer.

The chip card 700 shown in FIG. 7B is produced using a chip card body 400 according to various exemplary aspects. The chip with the antenna connected thereto can be inserted into the chip card body 400 in an essentially known manner, for example as a glued-in chip module 108.

Figure 6:
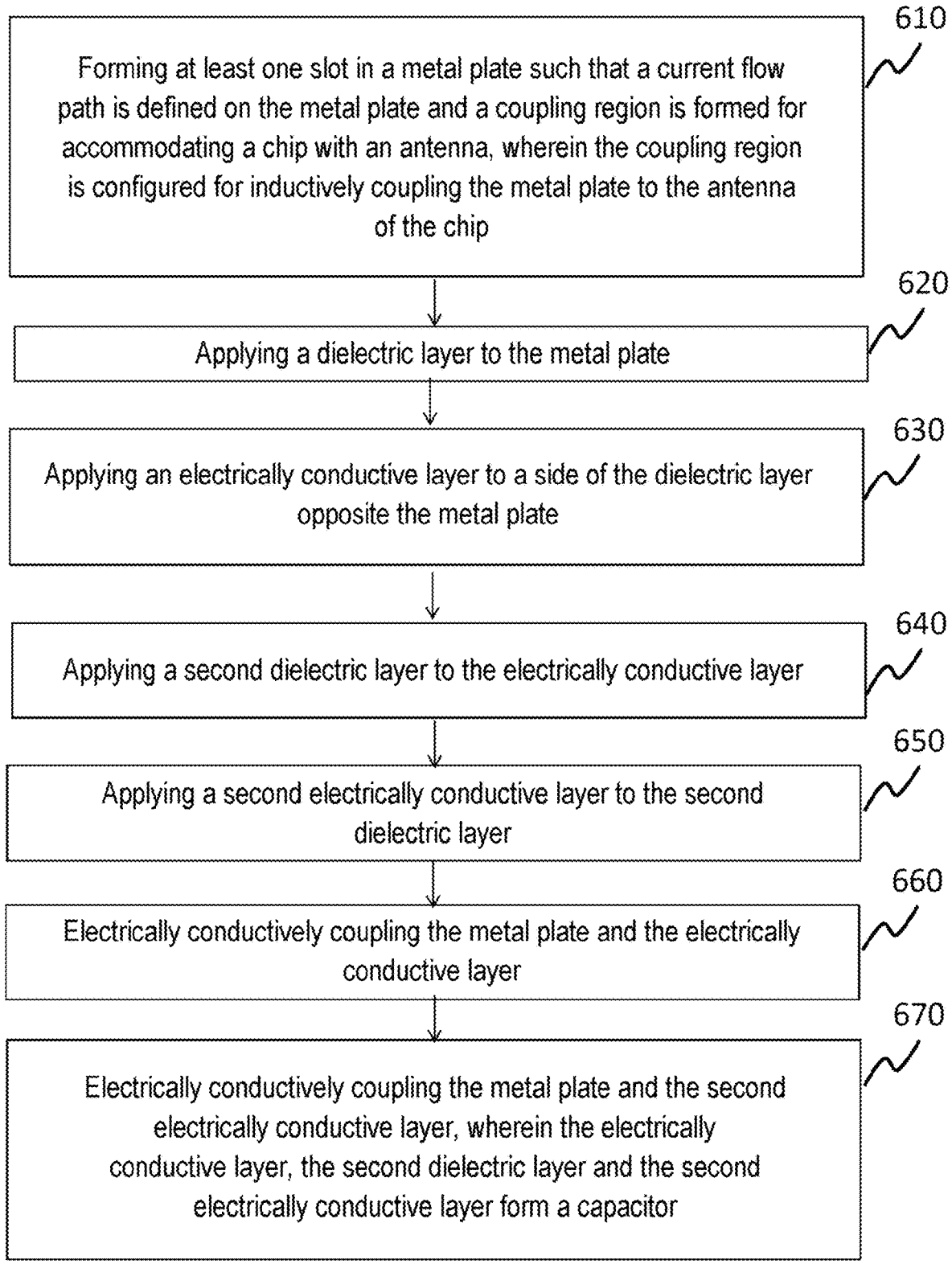
FIG. 6 shows a flowchart of a method for forming a chip card body according to various exemplary aspects.

FIG. 6 shows a flowchart 600 of a method for forming a chip card body according to various exemplary aspects.

The chip card body comprises forming at least one slot in a metal plate such that a current flow path is defined on the metal plate and a coupling region is formed for accommodating a chip with an antenna, wherein the coupling region is configured for inductively coupling the metal plate to the antenna of the chip (at 610), applying a dielectric layer to the metal plate (at 620), applying an electrically conductive layer to a side of the dielectric layer opposite the metal plate (at 630), applying a second dielectric layer to the electrically conductive layer (at 640), applying a second electrically conductive layer to the second dielectric layer (at 650), electrically conductively coupling the metal plate and the electrically conductive layer (at 660) and electrically conductively coupling the metal plate and the second electrically conductive layer, wherein the electrically conductive layer, the second dielectric layer and the second electrically conductive layer form a capacitor (at 670).

In the following text, a summary of some exemplary aspects is given.

Exemplary aspect 1 is a chip card body. The chip card body comprises a metal plate having at least one slot which defines a current flow path on the metal plate, and having a coupling region for accommodating a chip with an antenna, wherein the coupling region is configured for inductively coupling the metal plate to the antenna of the chip, a dielectric layer applied to the metal plate, an electrically conductive layer applied to a side of the dielectric layer opposite the metal plate and at least one electrically conductive coupling between the metal plate and the electrically conductive layer, wherein the metal plate, the dielectric layer and the electrically conductive layer form a capacitor.

Exemplary aspect 2 is a chip card body. The chip card body comprises a metal plate having at least one slot which defines a current flow path on the metal plate, and having a coupling region for accommodating a chip with an antenna, wherein the coupling region is configured for inductively coupling the metal plate to the antenna of the chip, a dielectric layer applied to the metal plate, an electrically conductive layer applied to a side of the dielectric layer opposite the metal plate, a second dielectric layer on the electrically conductive layer, a second electrically conductive layer on the second dielectric layer, an electrically conductive coupling between the metal plate and the electrically conductive layer and a second electrically conductive coupling between the metal plate and the second electrically conductive layer, wherein the electrically conductive layer, the second dielectric layer and the second electrically conductive layer form a capacitor.

Exemplary aspect 3 is a chip card body according to exemplary aspect 1 or 2, wherein the dielectric layer is laminated and optionally, the electrically conductive layer is also laminated.

Exemplary aspect 4 is a chip card body according to exemplary aspect 2, wherein the second dielectric layer is laminated and optionally the second electrically conductive layer is also laminated.

Exemplary aspect 5 is a chip card body according to any one of the exemplary aspects 1 to 4, wherein the dielectric layer comprises an adhesive.

Exemplary aspect 6 is a chip card body according to any one of the exemplary aspects 2 to 5, wherein the second dielectric layer comprises an adhesive.

Exemplary aspect 7 is a chip card body according to any one of the exemplary aspects 1 to 6, wherein the electrically conductive coupling comprises an electrically conductive glue.

Exemplary aspect 8 is a chip card body according to any one of the exemplary aspects 1 to 7, wherein the electrically conductive coupling comprises a via filled with electrically conductive glue.

Exemplary aspect 9 is a chip card body according to any one of the exemplary aspects 1 to 8, wherein the electrically conductive layer comprises a main capacitor region and at least one tuning region, wherein the at least one tuning region is connected to the main capacitor region only by a narrow connecting region so that the tuning region can be separated from the main capacitor region by cutting through the connecting region.

Exemplary aspect 10 is a chip card body according to exemplary aspect 9, wherein the connecting region has a width not exceeding one tenth of the circumference of the electrically conductive layer.

Exemplary aspect 11 is a chip card body according to any one of the exemplary aspects 2 to 10, wherein the second electrically conductive layer comprises a main capacitor region and at least one tuning region, wherein the at least one tuning region is connected to the main capacitor region only by a narrow connecting region so that the tuning region can be separated from the main capacitor region by cutting through the connecting region.

Exemplary aspect 12 is a chip card body according to exemplary aspect 11, wherein the connecting region has a width not exceeding one tenth of the circumference of the second electrically conductive layer.

Exemplary aspect 13 is a chip card body according to any one of the exemplary aspects 1 to 12, wherein the electrically conductive layer comprises at least one slot.

Exemplary aspect 14 is a chip card body according to exemplary aspect 13, wherein the at least one slot of the electrically conductive layer extends above the slot of the metal plate.

Exemplary aspect 15 is a chip card body according to any one of the exemplary aspects 1 to 14, wherein the electrically conductive layer essentially completely covers the metal plate.

Exemplary aspect 16 is a chip card body according to any one of the exemplary aspects 1 to 14, wherein the electrically conductive layer only partially covers the metal plate.

Exemplary aspect 17 is a method for forming a chip card body. The chip card body comprises forming at least one slot in a metal plate such that a current flow path is defined on the metal plate and a coupling region is formed for accommodating a chip with an antenna, wherein the coupling region is configured for inductively coupling the metal plate to the antenna of the chip, applying a dielectric layer to the metal plate, applying an electrically conductive layer to a side of the dielectric layer opposite the metal plate, and electrically conductively coupling the metal plate and the electrically conductive layer, wherein the metal plate, the dielectric layer and the electrically conductive layer form a capacitor.

Exemplary aspect 18 is a method for forming a chip card body. The chip card body comprises forming at least one slot in a metal plate such that a current flow path is defined on the metal plate and a coupling region is formed for accommodating a chip with an antenna, wherein the coupling region is configured for inductively coupling the metal plate to the antenna of the chip, applying a dielectric layer to the metal plate, applying an electrically conductive layer to a side of the dielectric layer opposite the metal plate, applying a second dielectric layer to the electrically conductive layer, applying a second electrically conductive layer to the second dielectric layer, electrically conductively coupling the metal plate and the electrically conductive layer and electrically conductively coupling the metal plate and the second electrically conductive layer, wherein the electrically conductive layer, the second dielectric layer and the second electrically conductive layer form a capacitor.

Exemplary aspect 19 is a method according to exemplary aspect 17 or 18, which further comprises laminating the dielectric layer onto the metal plate and optionally laminating the electrically conductive layer onto the dielectric layer.

Exemplary aspect 20 is a method according to exemplary aspect 17 or 18, which further comprises simultaneously laminating the dielectric layer and the electrically conductive layer.

Exemplary aspect 21 is a method according to exemplary aspect 18, which comprises laminating the second dielectric layer onto the metal plate and optionally laminating the second electrically conductive layer onto the dielectric layer.

Exemplary aspect 22 is a method according to exemplary aspect 18, which comprises simultaneously laminating the second dielectric layer and the second electrically conductive layer.

Exemplary aspect 23 is a method according to exemplary aspect 18, which comprises simultaneously laminating the dielectric layer, the electrically conductive layer, the second dielectric layer, and the second electrically conductive layer.

Exemplary aspect 24 is a method according to any one of the exemplary aspects 17 to 23, wherein the dielectric layer comprises an adhesive.

Exemplary aspect 25 is a method according to any one of the exemplary aspects 18 to 24, wherein the second dielectric layer comprises an adhesive.

Exemplary aspect 26 is a method according to any one of the exemplary aspects 17 to 25, wherein the electrically conductive coupling comprises making a connection by means of an electrically conductive glue.

Exemplary aspect 27 is a method according to any one of the exemplary aspects 17 to 26, wherein the electrically conductive coupling comprises filling a via with electrically conductive glue.

Exemplary aspect 28 is a method according to any one of the exemplary aspects 17 to 27, wherein the electrically conductive layer comprises a main capacitor region and at least one tuning region, wherein the at least one tuning region is connected to the main capacitor region only by a narrow connecting region so that the tuning region can be separated from the main capacitor region by cutting through the connecting region.

Exemplary aspect 29 is a method according to exemplary aspect 28, wherein the connecting region has a width not exceeding one tenth of the circumference of the electrically conductive layer.

Exemplary aspect 30 is a method according to any one of the exemplary aspects 18 to 29, wherein the second electrically conductive layer comprises a main capacitor region and at least one tuning region, wherein the at least one tuning region is connected to the main capacitor region only by a narrow connecting region so that the tuning region can be separated from the main capacitor region by cutting through the connecting region.

Exemplary aspect 31 is a method according to exemplary aspect 30, wherein the connecting region has a width not exceeding one tenth of the circumference of the electrically conductive layer.

Exemplary aspect 32 is a method according to any one of the exemplary aspects 17 to 31, which further comprises forming at least one slot in the electrically conductive layer.

Exemplary aspect 33 is a method according to exemplary aspect 32, wherein the at least one slot of the electrically conductive layer extends above the slot of the metal plate.

Exemplary aspect 34 is a method according to any one of claims 17 to 33, wherein the electrically conductive layer essentially completely covers the metal plate.

Exemplary aspect 35 is a method according to any one of claims 17 to 33, wherein the electrically conductive layer only partially covers the metal plate.

Exemplary aspect 36 is a chip card. The chip card comprises a chip card body according to any one of the exemplary aspects 1 to 16 and a chip with an antenna, accommodated in the coupling region.

Exemplary aspect 37 is a chip card according to exemplary aspect 36, wherein the chip and the antenna are arranged on a common carrier.

Additional advantageous designs of the device are obtained from the description of the method and vice versa.

The invention claimed is:

1. A chip card body, comprising:
  a metal plate having at least one slot which defines a current flow path on the metal plate, and having a coupling region configured to accommodate a chip with an antenna, and configured to inductively couple the metal plate to the antenna of the chip;
  a dielectric layer applied to the metal plate;
  a first electrically conductive layer applied to a side of the dielectric layer opposite the metal plate, and comprising a main capacitor region and at least one tuning region,
  wherein the at least one tuning region is connected to the main capacitor region only by means of a narrow connecting region so that the tuning region is separable from the main capacitor region by cutting through the narrow connecting region; and
  at least one electrically conductive coupling between the metal plate and the first electrically conductive layer,
  wherein the metal plate, the dielectric layer, and the first electrically conductive layer form a capacitor.

2. The chip card body as claimed in claim 1, wherein the narrow connecting region has a width not exceeding one tenth of the circumference of the first electrically conductive layer.

3. The chip card body as claimed in claim 1, wherein the first electrically conductive layer comprises at least one slot.

4. The chip card body as claimed in claim 3, wherein the at least one slot of the first electrically conductive layer extends above the slot of the metal plate.

5. A chip card, comprising:
  a chip card body as claimed in claim 1; and
  a chip accommodated in the coupling region and having an antenna.

6. A chip card body, comprising:
  a metal plate having at least one slot which defines a current flow path on the metal plate, and having a coupling region configured to receive a chip with an antenna, and configured to inductively couple the metal plate with the antenna of the chip;

a dielectric layer applied to the metal plate;
a first electrically conductive layer applied to a side of the dielectric layer opposite the metal plate;
a second dielectric layer on the first electrically conductive layer; and
a second electrically conductive layer on the second dielectric layer;
an electrically conductive coupling between the metal plate and the first electrically conductive layer; and
a second electrically conductive coupling between the metal plate and the second electrically conductive layer, and comprising a main capacitor region and at least one tuning region,
wherein the at least one tuning region is connected to the main capacitor region only by means of a narrow connecting region so that the tuning region can be separated from the main capacitor region by cutting through the narrow connecting region, and
wherein the first electrically conductive layer, the second dielectric layer, and the second electrically conductive layer form a capacitor.

7. The chip card body as claimed in claim 6,
wherein the narrow connecting region has a width not exceeding one tenth of the circumference of the second electrically conductive layer.

* * * * *